(12) United States Patent
Wang et al.

(10) Patent No.: US 9,330,747 B2
(45) Date of Patent: May 3, 2016

(54) NON-VOLATILE LATCH USING SPIN-TRANSFER TORQUE MEMORY DEVICE

(71) Applicants: Yih Wang, Portland, OR (US); Fatih Hamzaoglu, Portland, OR (US)

(72) Inventors: Yih Wang, Portland, OR (US); Fatih Hamzaoglu, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/894,266

(22) Filed: May 14, 2013

(65) Prior Publication Data

US 2014/0340957 A1 Nov. 20, 2014

(51) Int. Cl.
*G11C 11/16* (2006.01)

(52) U.S. Cl.
CPC .......... *G11C 11/1673* (2013.01); *G11C 11/161* (2013.01)

(58) Field of Classification Search
USPC .............................. 365/205, 185, 185.21, 158
See application file for complete search history.

(56) References Cited

U.S. PATENT DOCUMENTS

| | | | | |
|---|---|---|---|---|
| 5,517,462 A | * | 5/1996 | Iwamoto et al. | 365/195 |
| 7,286,394 B2 | * | 10/2007 | Ooishi | 365/158 |
| 7,599,210 B2 | * | 10/2009 | Okazaki et al. | 365/148 |
| 7,894,251 B2 | * | 2/2011 | Kanda | 365/158 |
| 8,174,872 B2 | * | 5/2012 | Sakimura et al. | 365/158 |
| 8,547,736 B2 | * | 10/2013 | Rao et al. | 365/171 |
| 8,693,240 B1 | * | 4/2014 | Abedifard et al. | 365/158 |
| 2013/0322190 A1 | * | 12/2013 | Vikash et al. | 365/189.16 |

* cited by examiner

*Primary Examiner* — Amir Zarabian
*Assistant Examiner* — Minh Dinh
(74) *Attorney, Agent, or Firm* — Blakely, Sokoloff, Taylor & Zafman LLP

(57) ABSTRACT

Described is an apparatus of a non-volatile logic (NVL), the apparatus comprises: a sensing circuit to sense differential resistance; a first magnetic-tunneling-junction (MTJ) device coupled to the sensing circuit; a second MTJ device coupled to the sensing circuit, the first and second MTJ devices operable to provide differential resistance; and a buffer to drive complementary signals to the first and second MTJ devices respectively.

21 Claims, 6 Drawing Sheets

NON-VOLATILE LATCH USING SPIN-TRANSFER TORQUE MEMORY DEVICE

BACKGROUND

Non-volatile logic (NVL) and memory circuits using Spin-Transfer Torque (STT) switched Magnetic Tunnel Junction (MTJ) device have attracted growing interests in low-power SoC (System-on-Chip), as they show promise to realize logic and memory functions with non-volatility and programmability with resilience to Soft Error Rate (SER).

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
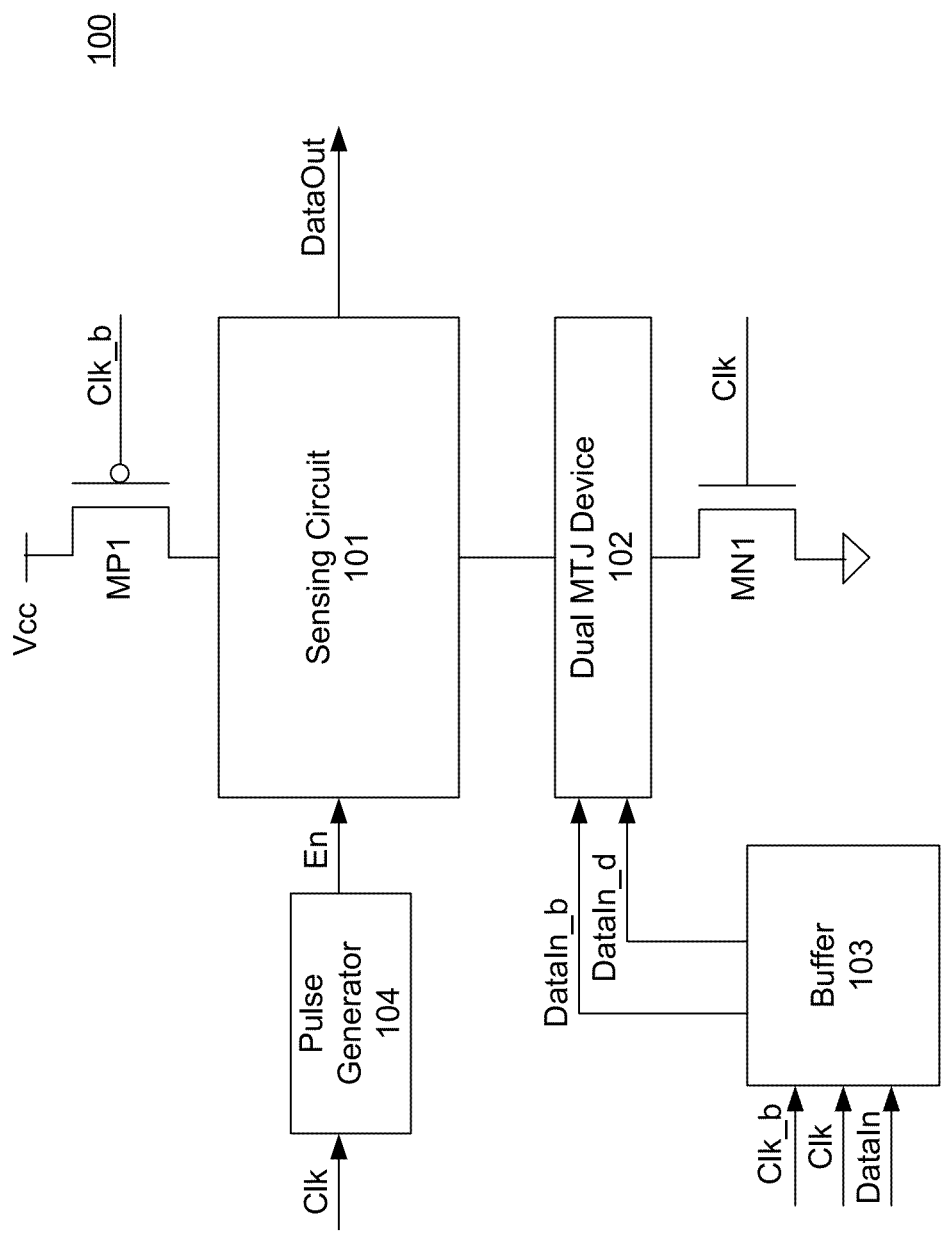
FIG. 1 is high level architecture of a non-volatile latch (NVL) using dual magnetic-tunneling-junction (MTJ) devices, according to one embodiment of the disclosure.

The embodiments describe a non-volatile latch (NVL) circuit architecture using dual Magnetic Tunnel Junction (MTJ) devices to store state when power supply is turned off. Each MTJ device has a fixed magnetic layer and a free magnetic layer. In one embodiment, the free magnetic layer magnetization orientation can change with the write current direction. The embodiments enable the implementation of general purpose non-volatile logic circuits in normally off and instantly on applications. The embodiments can also be used as multiple time programmable (MTP) memory and may replace existing MTP memories such as embedded EEPROM (Electrically Erasable Programmable Read-Only Memory), Flash (e.g., NAND and NOR flash devices), PROMs (programmable read-only memories e.g., fuse) and SONOS (Silicon-Oxide-Nitride-Oxide-Silicon) which are available only in the older generations of process technology due to process scaling challenge.

The embodiment of NVL circuit using dual STT switched MTJ devices enables an area efficient method to implement non-volatile state element and MTP device in general purpose non-volatile logic circuits. The write scheme described with reference to the embodiments improves the endurance of MTJ devices by lowering the voltage across MTJ devices during write operation, hence reducing the risk of dielectric breakdown of MTJ device. The embodiments also use differential sensing of dual MTJ devices with complementary resistance states, which improves read margin.

In one embodiment, the MTJ devices of the dual MTJ device comprise two serially coupled MTJ devices which behave as storage elements. In one embodiment, the fixed magnetic layers of the two MTJ devices are coupled to the same metal layer. In one embodiment, write operation is performed by passing current through the serially coupled MTJ devices. In this embodiment, direction of the current determines the resistance states of the two MTJ devices. In one embodiment, a sensing circuit is used to sense differential resistance by sensing resistance states of the two MTJ devices. In one embodiment, a 7-transistor (7-bit) pulsed sense amplifier is used to read data stored in the dual MTJ devices. In other embodiments, fewer or more than seven transistors may be used to implement the pulsed sense amplifier or sensing circuit.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct electrical connection between the things that are connected, without any intermediate devices. The term "coupled" means either a direct electrical connection between the things that are connected or an indirect connection through one or more passive or active intermediary devices. The term "circuit" means one or more passive and/or active components that are arranged to cooperate with one another to provide a desired function. The term "signal" means at least one current signal, voltage signal or data/clock signal. The meaning of "a," "an," and the include plural references. The meaning of in includes in and "on."

The term "scaling" generally refers to converting a design (schematic and layout) from one process technology to another process technology. The term "scaling" generally also refers to downsizing layout and devices within the same technology node. The terms "substantially," "close," "approximately," "near," "about," etc., generally refer to being within +/−20% of a target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For purposes of the embodiments, the transistors are metal oxide semiconductor (MOS) transistors, which include drain, source, gate, and bulk terminals. The transistors also include Tri-Gate and FinFet transistors. Source and drain terminals may be identical terminals and are interchangeably used herein. Those skilled in the art will appreciate that other transistors, for example, Bi-polar junction transistors—BJT PNP/NPN, BiCMOS, CMOS, eFET, etc., may be used without departing from the scope of the disclosure. The term "MN" indicates an n-type transistor (e.g., NMOS, NPN BJT, etc.) and the term "MP" indicates a p-type transistor (e.g., PMOS, PNP BJT, etc.).

FIG. 1 is high level architecture 100 of an NVL using dual MTJ devices, according to one embodiment of the disclosure. In one embodiment, architecture 100 comprises a sensing circuit 101, dual MTJ device 102, buffer 103, pulse generator 104, switching n-type device MN1, and switching p-type device MP1.

In one embodiment, buffer 103 receives input data DataIn which is stored in dual MTJ device 102. In this embodiment, the operations of reading and writing DataIn is synchronized with a clock signal (Clk), where Clk_b is an inverted version of Clk. In one embodiment, buffer 103 generates an inverted version of DataIn as DataIn_b and a buffered version of DataIn as DataIn_d. In one embodiment, signals DataIn_b and DataIn_d determine the current flow through dual MTJ device 102, which determines the logical value of data stored in dual MTJ device 102. In one embodiment, dual MTJ device 102 is coupled to MN1, where drain terminal of n-type device MN1 is coupled to dual MTJ device 102, source terminal of MN1 to a low potential (e.g., ground), and where gate terminal of MN1 receives Clk. In this embodiment, MN1 gates current path to ground according to logical level of Clk.

In one embodiment, sensing circuit 101 is coupled to dual MTJ device 102. While the embodiment shows dual MTJ device 102 coupled to MN1 and sensing circuit 101, dual MTJ device 102 can be coupled to p-type device MP1 and sensing circuit 101. In one embodiment, dual MTJ device 102 comprises two MTJ devices with their respective fixed magnetic layers electrically shorted with one another and coupled to drain terminal of MN1. In such an embodiment, free magnetic layers of the two MTJ devices are coupled to sensing circuit 101 and outputs of buffer 103 (i.e., outputs that provide DataIn_b and DataIn_d signals).

In one embodiment, sensing circuit 101 is coupled to MP1 which gates power supply (i.e., Vcc) to sensing circuit according to Clk_b. In one embodiment, sensing circuit 101 is operable to read data stored in dual MTJ device 102 by sensing resistance of one MTJ device relative to another MTJ device of dual MTJ device 102. The read data is output as DataOut. In one embodiment, pulse generator 104 generates a pulse "En" to enable reading by sensing circuit 101. In this embodiment, pulse generator 104 uses Clk to generate pulse En. In other embodiments, other forms/designs of pulse generator 104 may be used which may or may not use Clk.

FIG. 2A is a circuit 200 of an NVL using dual MTJ device, according to one embodiment of the disclosure. It is pointed out that those elements of FIG. 2A having the same reference numbers (or names) as the elements of any other figure can operate or function in any manner similar to that described, but are not limited to such.

In one embodiment, sensing circuit 201 (e.g., 101) comprises cross-coupled inverting logic. In one embodiment, cross-coupled inverting logic comprises a first inverting logic having p-type device MP2 coupled in series with n-type device MN2 such that gate terminals of MP2 and MN2 are electrically shorted by node n2. In this embodiment, drain terminals of MP2 and MN2 are coupled together to node n1 which is coupled to input of second inverting logic. The source terminal of MP2 is coupled to drain terminal of MP1 while source terminal of MN2 is coupled to dual MTJ device 102 and buffer 103 as node n3.

In one embodiment, second inverting logic comprises p-type device MP3 and n-type device MN3 coupled in series such that that gate terminals of MP3 and MN3 are electrically shorted by node n1, and drain terminals of MP3 and MN3 are coupled to node n2. In one embodiment, node n2 is coupled to input on inverter inv1 which generates DataOut (i.e., output data of the circuit). In another embodiment, node n3 is coupled to input of another inverter (not shown) to provide output.

In one embodiment, sensing circuit 201 comprises sense enable device (e.g., n-type device MN4) which is controllable (via its gate terminal) by En generated by pulse generator 204 (e.g., 104). In one embodiment, source and drain terminals of MN4 are coupled to nodes n1 and n2. In such an embodiment, En turns on MN4 for a short duration to cause nodes n1 and n2 to equalize (e.g., by charge sharing) or to initialize. In one embodiment, after nodes n1 and n2 are initialized, En signal causes MN4 to turn off which allows sensing circuit 101 to sense voltage difference between voltages on nodes n1 and n2. In one embodiment, sense enable device is a p-type device instead of an n-type device. In one embodiment, sense enable device is a transfer gate formed from a parallel combination of n-type and p-type devices.

In one embodiment, dual MTJ device 102 comprises first MTJ (MTJ1) device and second MTJ (MTJ2) devices. FIG. 2B is an MTJ device 220 (e.g., MTJ1 and MTJ2), according to one embodiment of the disclosure. It is pointed out that those elements of FIG. 2B having the same reference numbers (or names) as the elements of any other figure can operate or function in any manner similar to that described, but are not limited to such.

In one embodiment, MTJ device 220 comprises a first terminal 221 and a second terminal 222, where first terminal 221 is coupled to free magnetic layer 223, and where second terminal is coupled to fixed magnetic layer 225 (pattern shaded region). In one embodiment, a layer 224 (e.g., MgO—magnesium oxide) is sandwiched between fixed magnetic layer 225 and free magnetic layer 223. In one embodiment, MTJ device 220 exhibits different resistance depending upon direction of current through it. For example, when current flows from first terminal 221 to second terminal 222 then resistance is lower than when current flow from second terminal 222 to first terminal 221. Depending on the definition of current direction, changing current direction changes resistance of the MTJ device 220.

Referring back to FIG. 2A, in one embodiment, first terminal of MTJ1 is coupled to node n3 while second terminal of MTJ1 is coupled to drain terminal of MN1. In one embodiment, first terminal of MTJ2 is coupled to node n4 while second terminal of MTJ2 is coupled to drain terminal of MN1. In such an embodiment, fixed magnetic layers 225 of MTJ1 and MTJ2 are electrically shorted to the drain terminal of MN1. One technical effect of coupling MTJ1 and MTJ2 in series is to reduce voltage across each MTJ device to mitigate risk of breaking down insulator (layer 224) of MTJ device 220. In one embodiment, free magnetic layer 223 of MTJ1 is coupled to node n3 and free magnetic layer 223 of MTJ2 is coupled to node n4.

In one embodiment, buffer 203 (e.g., 103) comprises clock gated inverters inv2 and inv3, where inverter inv2 receives input DataIn and drives inverter inv3. In this embodiment, DataIn_b is driven by inverter inv2 on node n3 while DataIn_d is driven by inverter inv3 on node n4. In one embodiment, pulse generator 204 (e.g., 104) comprises a delay stage formed from inverters inv3 and inv4 coupled together in series, and a logic gate (e.g., AND gate) to perform AND operation on Clk and its delayed version (generated by inverter inv3). In one embodiment, AND gate is replaced by a NAND gate or NOR gate depending on the desired logical characteristics of En. In one embodiment, the pulse width of En is enough to initialize nodes n1 and n2 prior to reading output data.

In one embodiment, delay stage has a programmable delay to change the width of pulse En. For example, inverters inv3 and inv4 are current starved inverters, where current is starved using bias signals generated by a programmable bias generator to adjust delay of the inverters inv3 and inv4. In another example, more inverters are made available to be added by a programmable multiplexer in series to inverters inv3 and inv4 to change the width En.

In one embodiment, MTJ devices (MTJ1 and MTJ2) with complementary resistance states store the state information. In one embodiment, MTJ device 220 uses the same materials and structure as in STT-RAM and its dimension is optimized to enable long retention time for non-volatile logic application.

In one embodiment, when Clk is logical low, MN1, MP1, and sensing circuit 201 are turned off, and clock gated write buffer 203 is turned on. In this embodiment, resistances of two MTJ devices (MTJ1 and MTJ2) are programmed by data buffer 203. In one embodiment, the resistance values of MTJ1 and MTJ2 are determined by the direction of current flow through the serially coupled MTJ devices. As discussed above, the fixed magnetic layers 225 of two MTJ devices (MTJ1 and MTJ2) are coupled to the same metal layer in layout which is coupled to drain terminal of MN1.

In one embodiment, since the direction of current from fixed to free magnetic layers of two MTJ devices (MTJ1 and MTJ2) is opposite to one another, MTJ1 and MTJ2 have opposite resistance states. In one embodiment, the resistance state of MTJ 220 is determined by the DataIn voltage. When DataIn is logical high, current flows from MTJ2 to MTJ1, and MTJ2 and MTJ1 are programmed to low resistance state and high resistance state, respectively. In one embodiment, with two MTJ devices coupled in series, the voltage across each MTJ device is less than ⅔ of supply voltage (Vcc). Such an embodiment, limits the risk of MgO (layer 224) breakdown.

In one embodiment, when clock Clk is logical high, write buffer 203 is tri-stated. In one embodiment, self-timed signal En generated by pulse generator circuit 204 is used to initialize nodes n1 and n2. For example, assertion of En equalizes nodes n1 and n2 and initiates the read operation. In one embodiment, when En is logically low, the cross-coupled latch formed by transistors MN2, MN3, MP2, and MP3 resolves to one of two stable states, depending on the resistance values of MTJ1 and MTJ2. For example, a high MTJ1 resistance and low MTJ2 resistance generates a logical high on DataOut, and vice versa. In this embodiment, the complementary MTJ resistance states of MTJ1 and MTJ2 ensure robust margin of sensing circuit.

Figure 2:
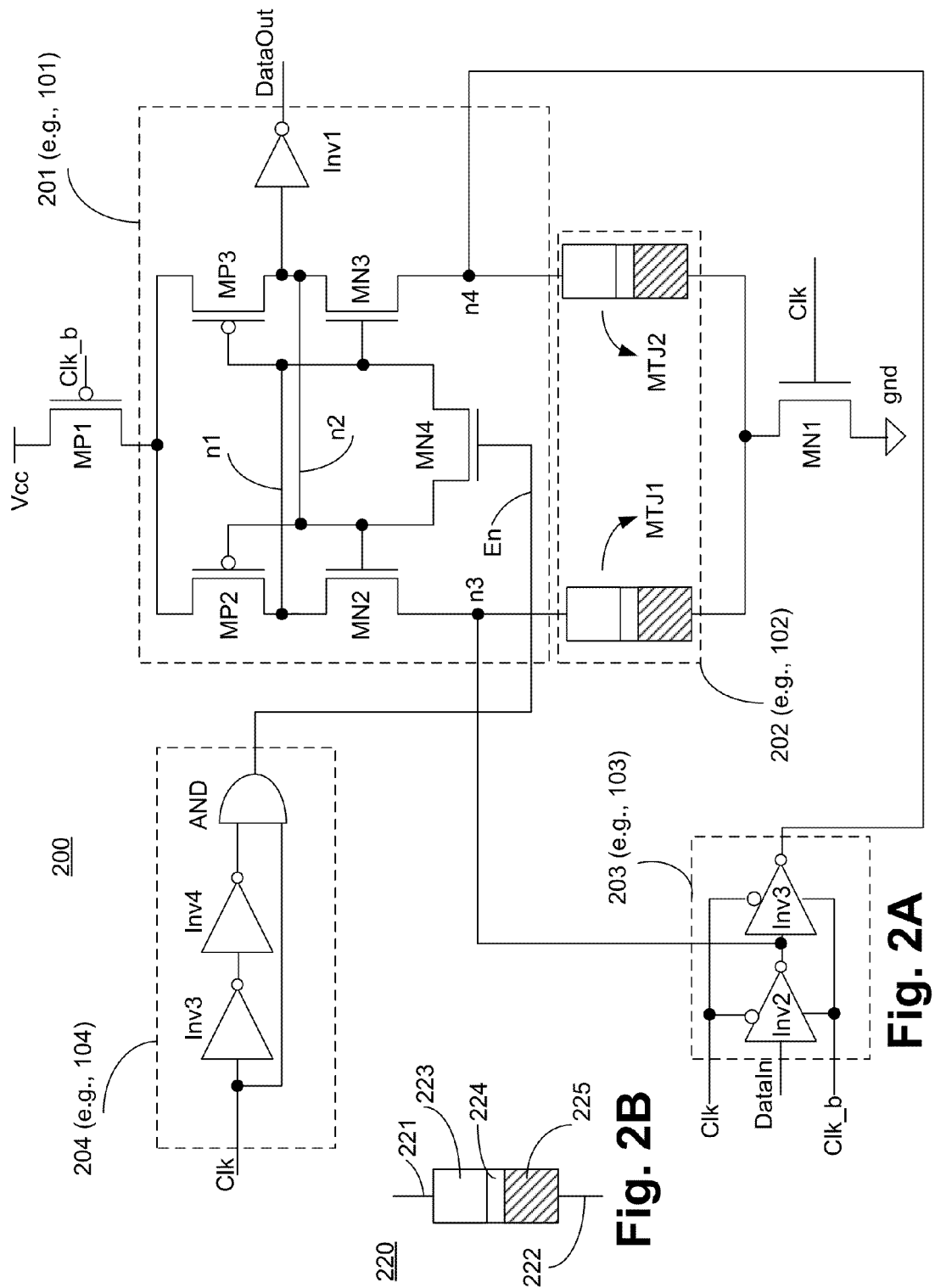
FIG. 2A is a circuit of an NVL using dual MTJ devices, according to one embodiment of the disclosure.
FIG. 2B is an MTJ device, according to one embodiment of the disclosure.
Figure 3:
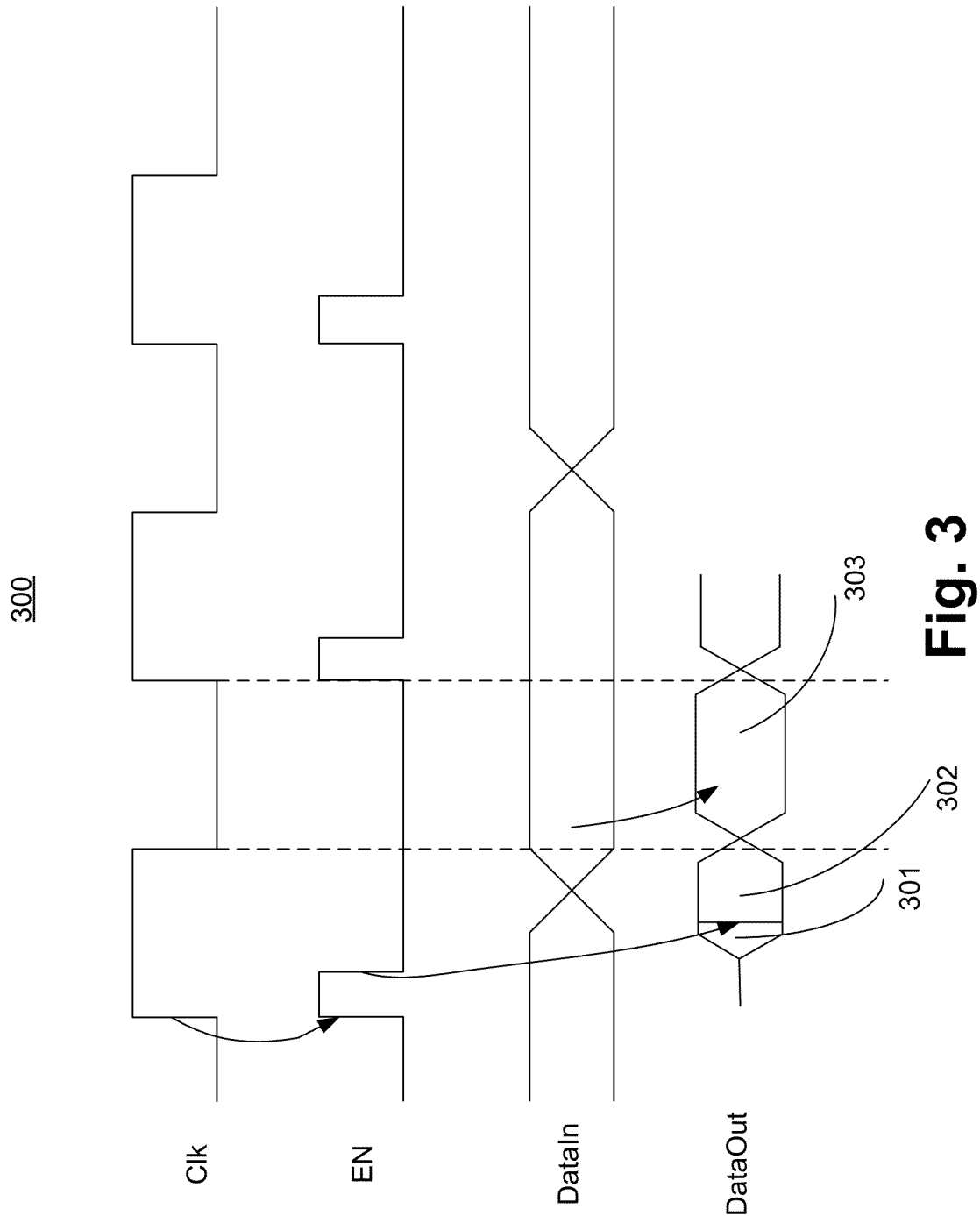
FIG. 3 is a timing diagram of the high level architecture of FIG. 1, according to one embodiment.

FIG. 3 is a timing diagram 300 of the high level architecture of FIGS. 1-2, according to one embodiment. It is pointed out that those elements of FIG. 3 having the same reference numbers (or names) as the elements of any other figure can operate or function in any manner similar to that described, but are not limited to such.

The first waveform from the top is clock signal (Clk) toggling periodically. The second waveform from the top is enable signal En generated by pulse generator 204. The width of the pulse depends on the delays of inverters inv3, inv4, and logic gate (e.g., AND gate). The third signal from the top is an exemplary DataIn signal. The fourth signal from the top is DataOut signal.

In one embodiment, when En signal is asserted i.e., when pulse of En is generated, then nodes n1 and n2 are initialized which is shown by section 301. Following the initialization of nodes n1 and n2, DataOut is read which is indicated by section 302. Section 303 shows the region when Clk is low and data is being written into dual MTJ device 202.

Figure 4:
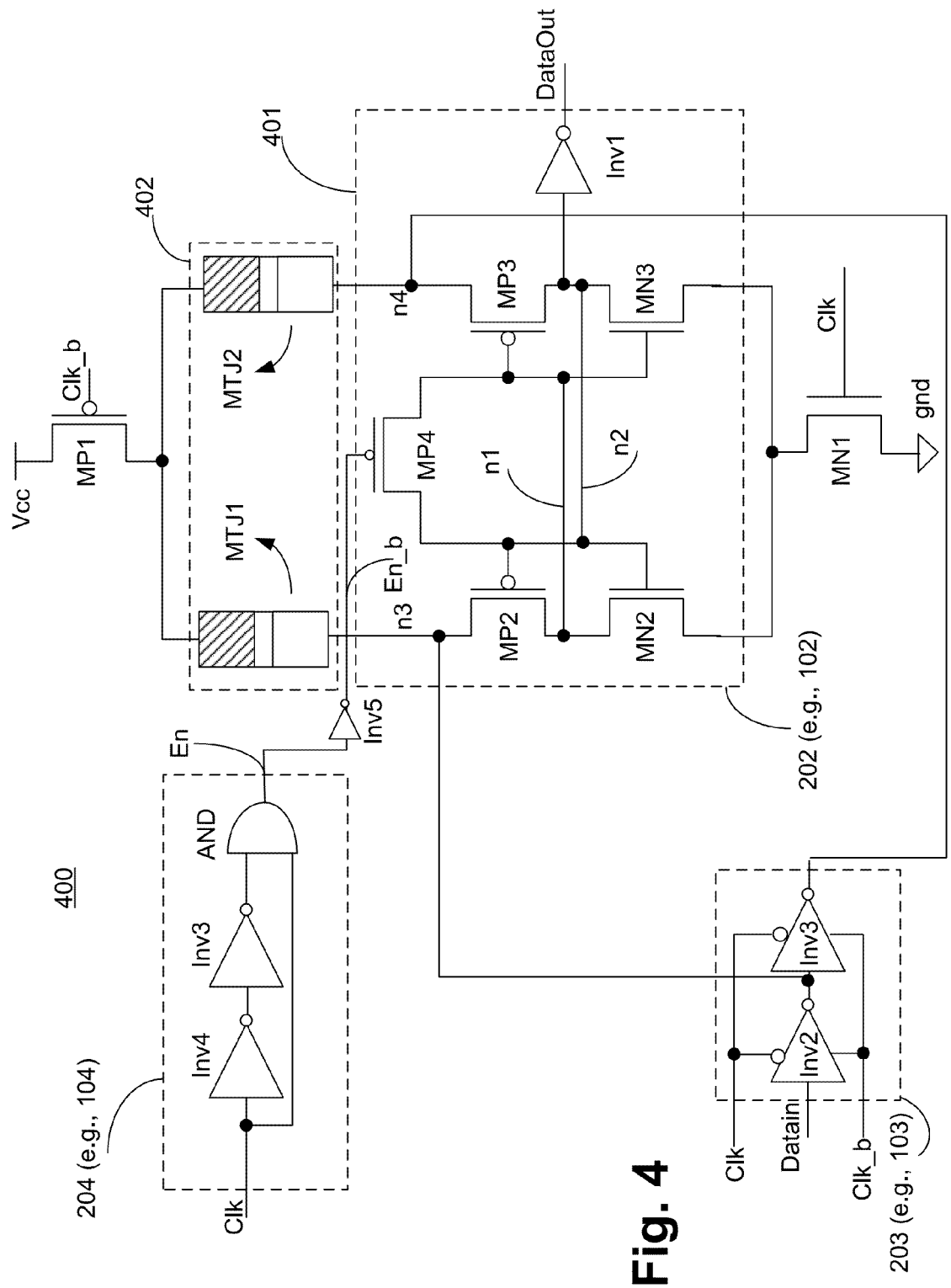
FIG. 4 is a circuit of an NVL using dual MTJ devices, according to another embodiment of the disclosure.

FIG. 4 is a circuit 400 of a NVL using dual MTJ devices, according to another embodiment of the disclosure. It is pointed out that those elements of FIG. 4 having the same reference numbers (or names) as the elements of any other figure can operate or function in any manner similar to that described, but are not limited to such.

So as not to obscure the embodiments of the disclosure, circuits already described are not described again. The embodiment, of FIG. 4 is similar to the embodiment of FIG. 2, but for the following changes. In circuit 400, sensing circuit 401 is configured so that source terminals of MN2 and MN3 are coupled to drain terminal of MN1 while source terminals of MP2 and MP3 are coupled to first terminals of MTJ1 and MTJ2 of dual MTJ device 402. First terminal of MTJ1 is coupled to node n3 which receives DataIn_b while first terminal of MTJ2 is coupled to node n4 which receives DataIn_d. In this embodiment, fixed magnetic layers 225 of MTJ1 and MTJ2 are coupled to drain terminal of MP1.

In one embodiment, sensing device of sensing circuit 401 is a p-type device MP4 which is controllable by En_b signal, which is inverted version of En signal (inverted by inverter inv5). In this embodiment, source and drain terminals of MP4 initialize nodes n1 and n2 when En_b pulse is de-asserted. In one embodiment, MP4 is replaced by an n-type device and logic of En and/or En_b is changed accordingly to type of device used for initializing nodes n1 and n2 prior to reading data from dual MTJ device 402. The operation of circuit 400 is similar to operation of circuit 200.

Figure 5:
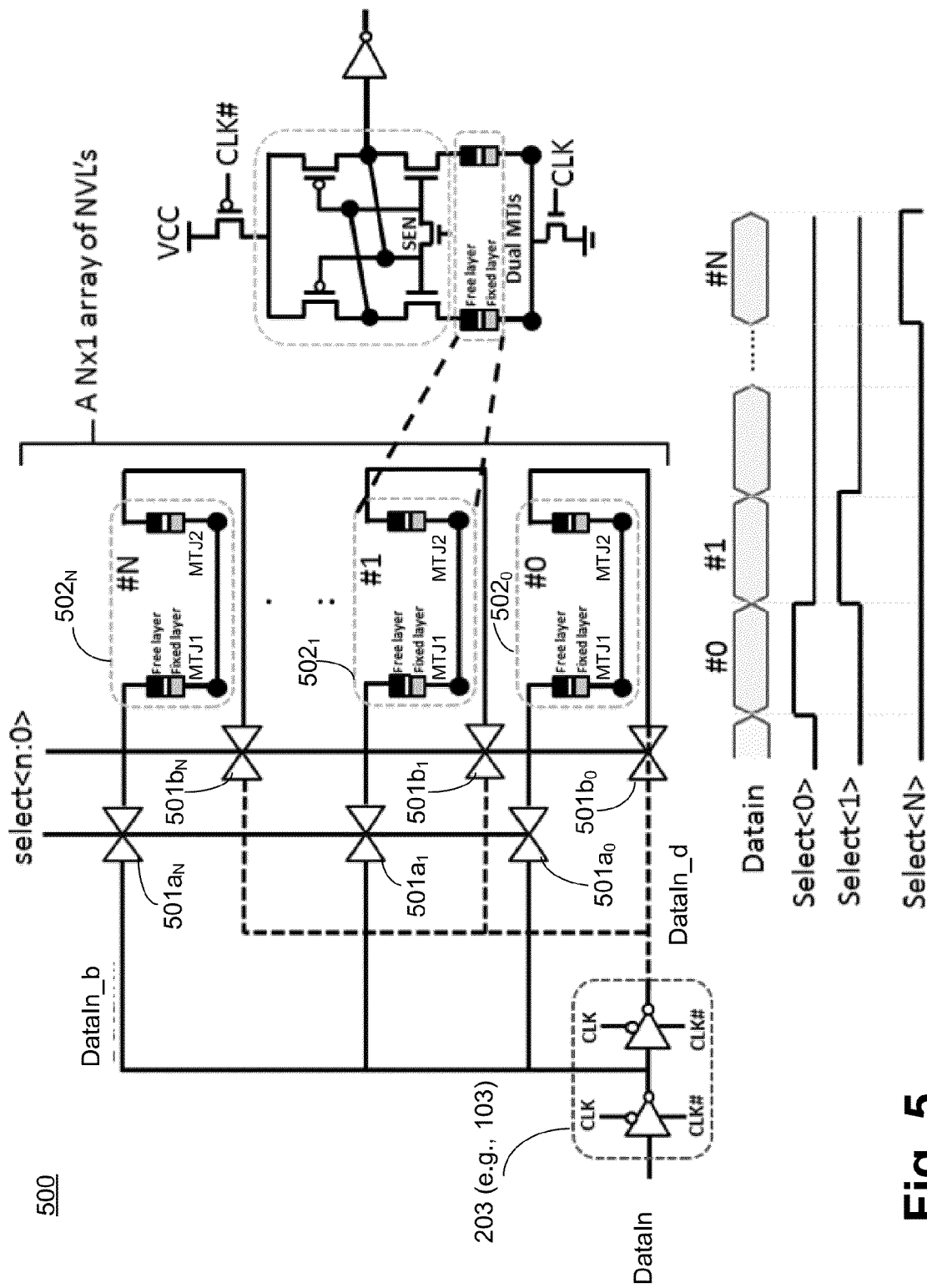
FIG. 5 is an array of NVLs using dual MTJ devices, according to one embodiment of the disclosure.

FIG. 5 is an array 500 of NVLs using dual MTJ devices, according to one embodiment of the disclosure. It is pointed out that those elements of FIG. 5 having the same reference numbers (or names) as the elements of any other figure can operate or function in any manner similar to that described, but are not limited to such.

The embodiment of FIG. 5 illustrates the scheme to write data to dual MTJ devices in an array of NVL latch. In one embodiment, array 500 is an N×1 array, where 'N' is an integer which is equal or greater than one. In on embodiment, array 500 comprises a selection unit having a plurality of multiplexers $501a_{0-N}$ and $501b_{0-N}$, where 'N' is a integer which is equal or greater than one. In one embodiment, array 500 comprises a plurality of dual MTJ devices $502_{0-N}$, where 'N' is an integer which is equal or greater than one. In one embodiment, each of the MTJ device of each of the plurality of dual MTJ devices $502_{0-N}$ is coupled to one of the multiplexers from the plurality of multiplexers $501a_{0-N}$.

For example, MTJ1 of $502_0$ is coupled to multiplexer $501a_0$ which allows DataIn_b to couple to MTJ1 when $501a_0$ is enabled by select signal (one of the bits of select<n:0>, where 'n' is an integer greater or equal to one. In this example, MTJ1 of $502_0$ is coupled to multiplexer $501b_0$ which allows DataIn_d to couple to MTJ2 when $501b_0$ is enabled by select signal. In one embodiment, when select<0> is enabled, DataIn #0 is stored in dual MTJ device $502_0$. In this example, when select<1> is enabled, DataIn #1 is stored in dual MTJ device $502_1$. Likewise, when select<N> is enabled, DataIn #N is stored in dual MTJ device $502_N$.

A common data buffer 203 is employed to write data serially to NVL array through selection multiplexers ($501a_{0-N}$ and $501b_{0-N}$). In one embodiment, address decoder (not shown) is used to provide the address select signal (i.e., select<n:0>) to determine which dual MTJ device in NVL array 500 will be updated (i.e., written to) with data from write buffer.

In one embodiment, each of the plurality of dual MTJ devices $502_{0-N}$ is coupled to its corresponding cross-coupled latch (i.e., sensing circuit). In one embodiment, a single sensing circuit is operable to be coupled to any one of the selected dual MTJ device. For example, if select<1> is enabled, then dual MTJ device $502_1$ is enabled to be written to, depending on logical level of Clk. In this example, another pair of multiplexers (not shown) can couple nodes n3 and n4 of the sensing circuit 201 to the selected dual MTJ device $502_1$. In such an embodiment, a single sensing circuit can selectively coupled to one of the dual MTJ devices which is selected to be written.

The embodiment of FIG. 5 can replace a traditional fuse array in processors which requires a high voltage (e.g., 2.8V) to burn a fuse, and which is a one time programmable storage device. The embodiments allow for NVL storage arrays which can be used multiple times without concerns (or negligible concern) for wear-leveling, soft error rate (SER), and operation at high voltage. For example, the embodiments can use low power supply (e.g., 1V) to operate and save data when power is lost. There is no minimum operating supply level needed to maintain storage of data because the data stored in MTJ devices is not lost when power is turned off. The embodiments thus allow for fast power up of a processor using these architectures.

Figure 6:
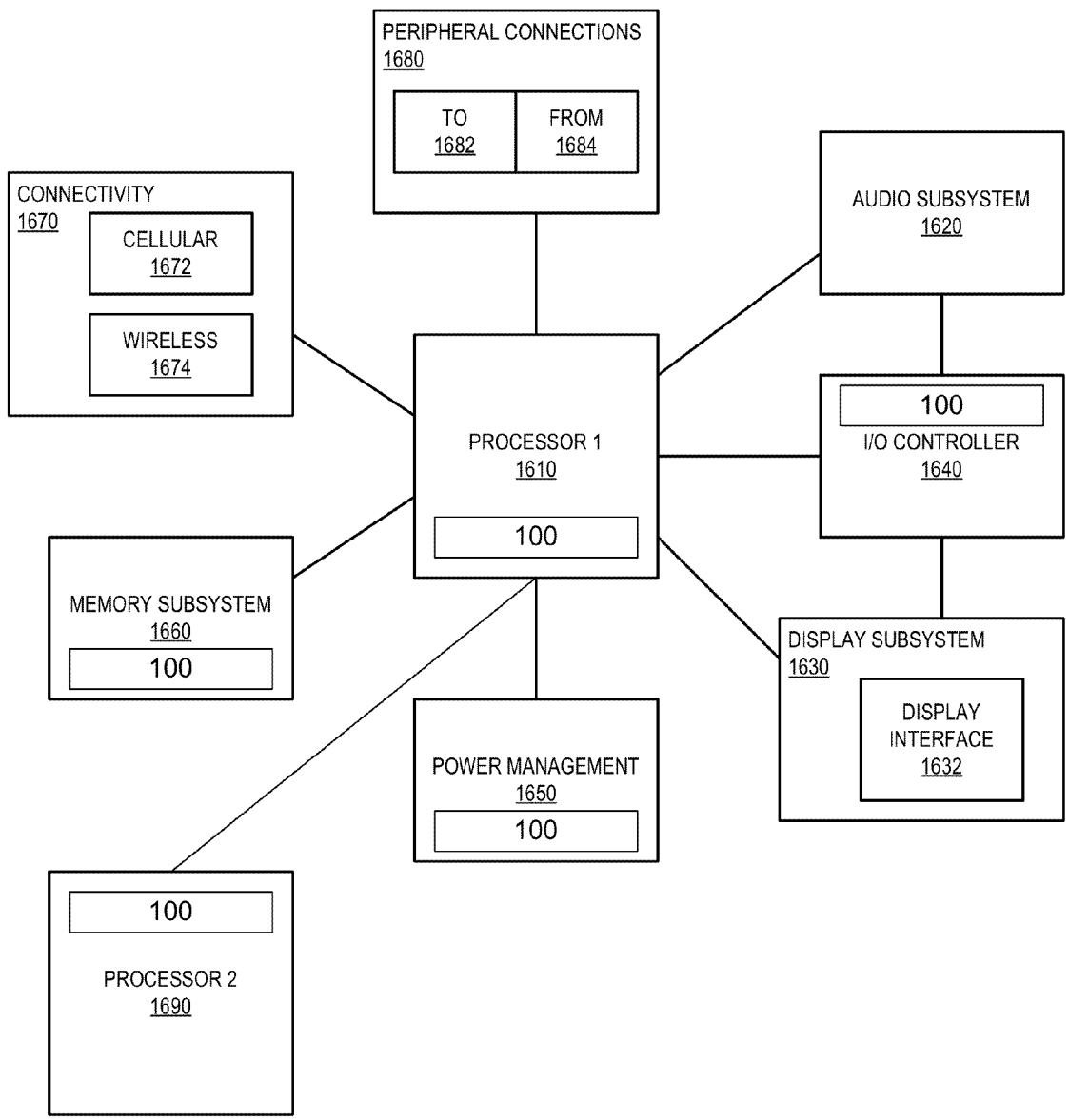
FIG. 6 is a smart device or a computer system or an SoC (System-on-Chip) including NVLs using dual MTJ devices, according to one embodiment of the disclosure.

FIG. 6 is a smart device or a computer system or an SoC (system-on-chip) including non-volatile latches using dual MTJ devices, according to one embodiment of the disclosure. It is pointed out that those elements of FIG. 6 having the same reference numbers (or names) as the elements of any other figure can operate or function in any manner similar to that described, but are not limited to such.

FIG. 6 illustrates a block diagram of an embodiment of a mobile device in which flat surface interface connectors could be used. In one embodiment, computing device 1600 represents a mobile computing device, such as a computing tablet, a mobile phone or smart-phone, a wireless-enabled e-reader, or other wireless mobile device. It will be understood that certain components are shown generally, and not all components of such a device are shown in computing device 1600.

In one embodiment, computing device 1600 includes a first processor 1610 with circuit 100, according to the embodiments discussed. Other blocks of the computing device 1600 may also include circuit 100. The various embodiments of the present disclosure may also comprise a network interface within 1670 such as a wireless interface so that a system embodiment may be incorporated into a wireless device, for example, cell phone or personal digital assistant.

In one embodiment, processor 1610 (and processor 1690) can include one or more physical devices, such as microprocessors, application processors, microcontrollers, programmable logic devices, or other processing means. The processing operations performed by processor 1610 include the execution of an operating platform or operating system on which applications and/or device functions are executed. The processing operations include operations related to I/O (input/output) with a human user or with other devices, operations related to power management, and/or operations related to connecting the computing device 1600 to another device. The processing operations may also include operations related to audio I/O and/or display I/O.

In one embodiment, computing device 1600 includes audio subsystem 1620, which represents hardware (e.g., audio hardware and audio circuits) and software (e.g., drivers, codecs) components associated with providing audio functions to the computing device 1600. Audio functions can include speaker and/or headphone output, as well as microphone input. Devices for such functions can be integrated into computing device 1600, or connected to the computing device 1600. In one embodiment, a user interacts with the computing device 1600 by providing audio commands that are received and processed by processor 1610.

Display subsystem 1630 represents hardware (e.g., display devices) and software (e.g., drivers) components that provide a visual and/or tactile display for a user to interact with the computing device 1600. Display subsystem 1630 includes display interface 1632, which includes the particular screen or hardware device used to provide a display to a user. In one embodiment, display interface 1632 includes logic separate from processor 1610 to perform at least some processing related to the display. In one embodiment, display subsystem 1630 includes a touch screen (or touch pad) device that provides both output and input to a user.

I/O controller 1640 represents hardware devices and software components related to interaction with a user. I/O controller 1640 is operable to manage hardware that is part of audio subsystem 1620 and/or display subsystem 1630. Additionally, I/O controller 1640 illustrates a connection point for additional devices that connect to computing device 1600 through which a user might interact with the system. For example, devices that can be attached to the computing device 1600 might include microphone devices, speaker or stereo systems, video systems or other display devices, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of the computing device 1600. Additionally, audio output can be provided instead of, or in addition to display output. In another example, if display subsystem 1630 includes a touch screen, the display device also acts as an input device, which can be at least partially managed by I/O controller 1640. There can also be additional buttons or switches on the computing device 1600 to provide I/O functions managed by I/O controller 1640.

In one embodiment, I/O controller 1640 manages devices such as accelerometers, cameras, light sensors or other environmental sensors, or other hardware that can be included in the computing device 1600. The input can be part of direct user interaction, as well as providing environmental input to the system to influence its operations (such as filtering for noise, adjusting displays for brightness detection, applying a flash for a camera, or other features).

In one embodiment, computing device 1600 includes power management 1650 that manages battery power usage, charging of the battery, and features related to power saving operation. Memory subsystem 1660 includes memory devices for storing information in computing device 1600. Memory can include nonvolatile (state does not change if power to the memory device is interrupted) and/or volatile (state is indeterminate if power to the memory device is interrupted) memory devices. Memory subsystem 1660 can store application data, user data, music, photos, documents, or other data, as well as system data (whether long-term or temporary) related to the execution of the applications and functions of the computing device 1600.

Elements of embodiments are also provided as a machine-readable medium (e.g., memory 1660) for storing the computer-executable instructions (e.g., instructions to implement any other processes discussed herein). The machine-readable medium (e.g., memory 1660) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 1670 includes hardware devices (e.g., wireless and/or wired connectors and communication hardware) and software components (e.g., drivers, protocol stacks) to enable the computing device 1600 to communicate with external devices. The computing device 1600 could be separate devices, such as other computing devices, wireless access points or base stations, as well as peripherals such as headsets, printers, or other devices.

Connectivity 1670 can include multiple different types of connectivity. To generalize, the computing device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1674 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 1680 include hardware interfaces and connectors, as well as software components (e.g., drivers, protocol stacks) to make peripheral connections. It will be understood that the computing device 1600 could both be a peripheral device ("to" 1682) to other computing devices, as well as have peripheral devices ("from" 1684) connected to it. The computing device 1600 commonly has a "docking" connector to connect to other computing devices for purposes such as managing (e.g., downloading and/or uploading, changing, synchronizing) content on computing device 1600. Additionally, a docking connector can allow computing device 1600 to connect to certain peripherals that allow the computing device 1600 to control content output, for example, to audiovisual or other systems.

In addition to a proprietary docking connector or other proprietary connection hardware, the computing device 1600 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or an element, that does not mean there is only one of the elements.

If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. For example, other memory architectures e.g., Dynamic RAM (DRAM) may use the embodiments discussed. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

For example, an apparatus comprises: a sensing circuit to sense differential resistance; a first MTJ device coupled to the sensing circuit; a second MTJ device coupled to the sensing circuit, the first and second MTJ devices operable to provide differential resistance; and a buffer to drive complementary signals to the first and second MTJ devices respectively.

In one embodiment, the first MTJ device includes a first terminal coupled to the sensing circuit and a second terminal coupled to a device controllable by a signal. In one embodiment, the second MTJ device includes a first terminal coupled to the sensing circuit and a second terminal coupled to the device controllable by the signal. In one embodiment, the signal is a clock signal. In one embodiment, the buffer comprises drivers gated by the clock signal.

In one embodiment, the first and second MTJ devices are coupled together in series. In one embodiment, the sensing circuit comprises: cross-coupled transistors; and an enable transistor to initialize nodes of the cross-coupled transistors. In one embodiment, the apparatus further comprises a pulse generator coupled to the enable transistor. In one embodiment, the pulse generator to turn on the enable transistor during read operation. In one embodiment, a fixed magnetic layer of the first MTJ device is coupled to the fixed magnetic layer of the second MTJ device. In one embodiment, free magnetic layers of the first and second MTJ devices are coupled to the sensing circuit. In one embodiment, the first and second MTJ devices are operable to have complementary resistances.

In another example, an apparatus comprises: an array of dual MTJ devices; a plurality of selection units, each of which is coupled to each MTJ device in the array of dual MTJ devices; and a buffer to drive complementary signals to the plurality of selection units. In one embodiment, the apparatus further comprises a sensing circuit to sense differential resistance in a selected dual MTJ device from the array.

In one embodiment, each dual MTJ device comprises: a first MTJ device; and a second MTJ device coupled in series to the first MTJ device. In one embodiment, each of the first and second MTJ devices includes corresponding fixed magnetic layers which are coupled to each other. In one embodiment, each of the first and second MTJ devices is coupled to a sensing circuit to sense differential resistance and to generate an output according to the difference resistance.

In one embodiment, a system comprises: a processor including a latch which comprises: a sensing circuit to sense differential resistance; a first MTJ device coupled to the sensing circuit; a second MTJ device coupled to the sensing circuit, the first and second MTJ devices operable to provide differential resistance; and a buffer to drive complementary signals to the first and second MTJ devices respectively; an antenna; and a wireless interface coupled to the processor and to the antenna to communicatively link the processor to a wireless network.

In one embodiment, the system further comprises a display unit. In one embodiment, a fixed magnetic layer of the first MTJ device is coupled to the fixed magnetic layer of the second MTJ device. In one embodiment, the processor of the system includes the apparatus discussed above.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
   a sensing circuit to sense differential resistance;
   a first magnetic-tunneling-junction (MTJ) device having a first terminal and a second terminal;
   a second MTJ device having a first terminal and a second terminal,
      the first and second MTJ devices operable to provide differential resistance,
      the sensing circuit coupled to the first terminals of the first and second MTJ devices;
   a buffer coupled to the first terminals of the first and second MTJ devices to generate an inverted version of an input data on the first terminal of the first MTJ device and a buffered version of the input data on the first terminal of the second MTJ device; and
   a pulse generator to generate self-timed signal to initialize the sensing circuit.

2. The apparatus of claim 1, wherein the second terminals of the first and second MTJ devices are coupled to a device controllable by a signal.

3. The apparatus of claim 1, wherein the signal is a clock signal.

4. The apparatus of claim 3, wherein the buffer comprises drivers gated by the clock signal.

5. The apparatus of claim 1, wherein the first and second MTJ devices are coupled together in series.

6. The apparatus of claim 1, wherein the sensing circuit comprises:
   cross-coupled transistors; and
   an enable transistor coupled to the pulse generator to initialize nodes of the cross-coupled transistors.

7. The apparatus of claim 6, wherein the pulse generator to turn on the enable transistor during read operation.

8. The apparatus of claim 1, wherein a fixed magnetic layer of the first MTJ device is coupled to the fixed magnetic layer of the second MTJ device.

9. The apparatus of claim 1, wherein free magnetic layers of the first and second MTJ devices are coupled to the sensing circuit.

10. The apparatus of claim 1, wherein the first and second MTJ devices are operable to have complementary resistances.

11. The apparatus of claim 1, wherein the sensing circuit is coupled to a second device controllable by an inverse of the signal.

12. An apparatus comprising:
    an array of dual magnetic-tunneling-junction (MTJ) device, wherein each dual MTJ device comprises of a first MTJ device and a second MTJ device;
    a plurality of selection units, each of which is coupled to each MTJ device in the array of dual MTJ devices; and
    a buffer to generate complementary signals and drive the complimentary signals to the plurality of selection units at the same time.

13. The apparatus of claim 12 further comprises a sensing circuit to sense differential resistance in a selected dual MTJ device from the array.

14. The apparatus of claim 12, wherein the first MTJ device is coupled in series to the second MTJ device.

15. The apparatus of claim 14, wherein each of the first and second MTJ devices includes corresponding fixed magnetic layers which are coupled to each other.

16. The apparatus of claim 12, wherein each of the first and second MTJ devices is coupled to a sensing circuit to sense differential resistance and to generate an output according to the difference resistance.

17. The apparatus of claim 12, wherein the selection units comprise multiplexers.

18. A system comprising:
    a processor including a latch which comprises:
       a sensing circuit to sense differential resistance;
       a first magnetic-tunneling-junction (MTJ) device having a first terminal and a second terminal;
       a second MTJ device having a first terminal and a second terminal,
          the first and second MTJ devices operable to provide differential resistance,
          the sensing circuit coupled to the first terminals of the first and second MTJ devices;
       a pulse generator to generate self-timed signal to initialize the sensing circuit; and
       a buffer including drivers gated by the signal coupled to the first terminals of the first and second MTJ devices to drive complementary signals to the first terminals of the first and second MTJ devices respectively;
    an antenna; and
    a wireless interface coupled to the processor and to the antenna to communicatively link the processor to a wireless network.

19. The system of claim 18 further comprises a display unit.

20. The system of claim 18, wherein a fixed magnetic layer of the first MTJ device is coupled to the fixed magnetic layer of the second MTJ device.

21. The apparatus of claim 18, wherein the buffer generating an inverted version of an input data on the first terminal of the first MTJ device and a buffered version of the input data on the first terminal of the second MTJ device.

\* \* \* \* \*